(12) United States Patent
Mohanty et al.

(10) Patent No.: US 10,049,892 B2
(45) Date of Patent: Aug. 14, 2018

(54) METHOD FOR PROCESSING PHOTORESIST MATERIALS AND STRUCTURES

(71) Applicant: Tokyo Electron Limited, Tokyo (JP)

(72) Inventors: Nihar Mohanty, Clifton Park, NY (US); Eric Chih-Fang Liu, Guilderland, NY (US); Elliott Franke, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/145,010

(22) Filed: May 3, 2016

(65) Prior Publication Data
US 2016/0329207 A1 Nov. 10, 2016

Related U.S. Application Data

(60) Provisional application No. 62/158,266, filed on May 7, 2015.

(51) Int. Cl.
| | |
|---|---|
| *H01L 21/324* | (2006.01) |
| *H01L 21/033* | (2006.01) |
| *H01L 21/027* | (2006.01) |
| *G03F 7/004* | (2006.01) |
| *C23C 16/503* | (2006.01) |
| *G03F 7/16* | (2006.01) |
| *H01L 21/308* | (2006.01) |
| *B81C 1/00* | (2006.01) |

(52) U.S. Cl.
CPC ........ *H01L 21/324* (2013.01); *H01L 21/0273* (2013.01); *H01L 21/0337* (2013.01); *B81C 1/00404* (2013.01); *B81C 2201/017* (2013.01); *C23C 16/503* (2013.01); *G03F 7/004* (2013.01); *G03F 7/167* (2013.01); *H01L 21/3081* (2013.01); *H01L 21/3085* (2013.01); *H01L 21/3086* (2013.01)

(58) Field of Classification Search
CPC ............... H01L 21/324; H01L 21/0273; H01L 21/0337; H01L 21/3085; H01L 21/3081; H01L 21/3086; C23C 16/503; G03F 7/167; G03F 7/004; B81C 2201/017; B81C 1/00404
See application file for complete search history.

(56) References Cited

U.S. PATENT DOCUMENTS

| | | | |
|---|---|---|---|
| 2003/0148224 A1* | 8/2003 | Vahedi | G03F 7/427 430/314 |
| 2008/0087639 A1* | 4/2008 | Adams | H01L 21/0212 216/58 |
| 2008/0308526 A1* | 12/2008 | Pandhumsoporn | H01L 21/31138 216/37 |

* cited by examiner

*Primary Examiner* — Anita Karen Alanko
(74) *Attorney, Agent, or Firm* — Wood Herron & Evans LLP

(57) ABSTRACT

Techniques herein include methods of processing photoresist patterns and photoresist materials for successful use in multi-patterning operations. Techniques include combinations of targeted deposition, curing, and trimming to provide a post-processed resist that effectively enables multi-patterning using photoresist materials to function as mandrels. Photoresist patterns and mandrels are hardened, strengthened, and/or dimensionally adjusted to provide desired dimensions and/or mandrels enabling straight sidewall spacers. Polymer is deposited with tapered profile to compensate for compressive stresses of various conformal or subsequent films to result in a vertical profile despite any compression.

16 Claims, 4 Drawing Sheets

METHOD FOR PROCESSING PHOTORESIST MATERIALS AND STRUCTURES

CROSS REFERENCE TO RELATED APPLICATIONS

The present application claims the benefit of U.S. Provisional Patent Application No. 62/158,266, filed on May 7, 2015, entitled "Method for Processing Photoresist Materials and Structures," which is incorporated herein by reference in its entirety.

BACKGROUND OF THE INVENTION

This relates to microfabrication including fabrication of semiconductor devices.

Continuous micro-miniaturization of digital semiconductor devices has been the engine for economic growth for past three decades. The number of transistors being fabricated on chips approximately doubles every few years. This micro-miniaturization has continued from planar devices into three dimensional space. Continued scaling, however, has come at a cost. Patterning the progressively smaller dimensions at advanced technology nodes has grown in complexity. Starting with simple direct print using 193 nm dry lithography at relatively larger technology nodes, patterning for advanced nodes has moved into complicated multi-patterning schemes using 193 nm-immersion lithography. Some common multi-patterning techniques employed in industry include double and/or triple litho-etch (LELE or LELELE (LEx)), self-aligned double patterning (SADP), self-aligned quadruple patterning (SAQP), etc.

SUMMARY

Some efforts for continued scaling involve using extreme ultraviolet (EUV) lithography using 13.5 nm photons in the hope of providing a simple direct print approach. There are, however, significant challenges to successfully implementing EUV lithography. Not only are there complex technical challenges in providing a reliable functional EUV system, there is a cost challenge that can make using EUV patterning essentially prohibitive. As such, self-aligned multi-patterning is a working solution for continued scaling.

Self-aligned multi-patterning, however, has some cost-based challenges. One conventional approach for self-aligned quad patterning includes executing two self-aligned double patterning operations. Such a patterning flow conventionally uses two hard mandrels and corresponding etch stop layers and also hardmasks for making two layers of hard mandrels. Such an approach can be expensive because of the accompanying etch steps, wet cleans, and sacrificial layer depositions.

Using photoresist materials for defining critical dimensions and/or as mandrels would be beneficial and reduce multi-patterning costs. Photoresist materials, however, are "soft" materials compared to hardmask materials. Using photoresist as mandrels has historically been challenging because of pattern collapse. Conventionally, a photoresist pattern is used to create mandrels in an underlying hardmask layer with the underlying hardmask layer having mechanical properties sufficient to function as mandrel material. For example, when attempting to form sidewall spacers on photoresist mandrel, a photoresist mandrel is first conformally coated with a spacer material, such as an oxide. This conformally deposited material can exert a relatively enormous compressive stress on photoresist mandrels, which can cause such photoresist mandrels to deform. For example, a photoresist mandrel having a rectangular cross-section can become deformed resulting in a bell-shaped profile or trapezoidal profile. In other words, a photoresist mandrel can result in a positive vertical taper in that upper portions of the photoresist mandrel are collapsed together making a mandrel cross section narrow on top while essentially keeping an initial width at the base (wide base and narrow top). The result is severe leaning (inward leaning) of sidewall spacers, which frustrates use of sidewall spacers for continued patterning.

Another challenge with using photoresist mandrels and patterns for self-aligned double patterning is that of precisely controlling critical dimensions (CDs), critical dimension uniformity (CDU), line edge roughness (LER) and line width roughness (LWR). Precise control is beneficial because any percentage dimensional variation in mandrel CD/CDU results in three times the percentage dimensional variation after final patterning. For example, at 7 nm node fabrication, angstrom level control over the CD, CDU and LER/LWR is desired for mandrel etch.

Techniques herein include methods of processing photoresist patterns and photoresist materials for successful use in multi-patterning operations. Techniques include combinations of targeted deposition, curing, and trimming to provide a post-processed resist that effectively enables multi-patterning. Photoresist patterns and mandrels can be hardened, strengthened, and/or dimensionally adjusted to provide desired dimensions and/or mandrels enabling straight sidewall spacers. One embodiment includes a method for processing a substrate. A substrate is received having a first relief pattern. The first relief pattern is comprised of a photoresist material. The first relief pattern includes structures having vertical sidewalls. The first relief pattern is positioned on an underlying layer. A deposition process is executed that deposits an organic polymer on the first relief pattern. The deposition process includes a plasma-based deposition process that includes a curing agent. The curing agent generates VUV (vacuum ultraviolet) light during plasma-based deposition. The deposition process is controlled such that more organic polymer is deposited on upper portions of the structures of the first relief pattern as compared to organic polymer deposited on lower portions of the structures of the first relief pattern resulting in a reverse taper profile on vertical sidewalls of the structures in that the upper portions of the structures have wider cross-sections as compared to cross-sections of corresponding lower portions. Controlling the deposition process includes maintaining an isotropic deposition during plasma-based deposition.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include methods of processing photoresist patterns and photoresist materials for successful use in multi-patterning operations. Techniques include combinations of targeted deposition, curing, and trimming to provide a post-processed photoresist that effectively enables multi-patterning. Photoresist patterns and mandrels can be hardened, strengthened, and/or dimensionally adjusted to provide desired dimensions and/or mandrels enabling straight sidewall spacers.

Figure 1:
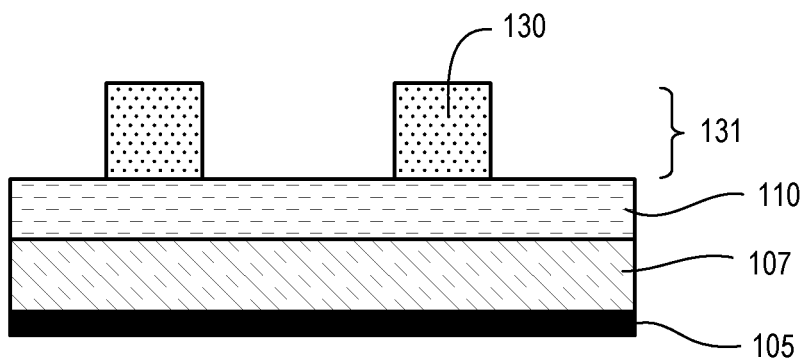
FIGS. 1-6 are cross-sectional schematic views of an example substrate segment showing a process flow according to embodiments disclosed herein.

One embodiment includes a method for processing a substrate. The method includes receiving a substrate having a first relief pattern. Referring to FIG. 1, the first relief pattern 131 is formed of a photoresist material. The first relief pattern includes structures 130 having (approximately) vertical sidewalls. The first relief pattern 131 is positioned on an underlying layer 110. This first relief pattern 131 can be formed using, for example, photolithography. A layer of photoresist can be exposed to a pattern of actinic radiation, and then developed to reveal a relief/topographic pattern. Note that any number of underlying layers can be included such as layer 107 and layer 105. Various layers can be labeled as target layers, memorization layers, etc.

Figure 2:
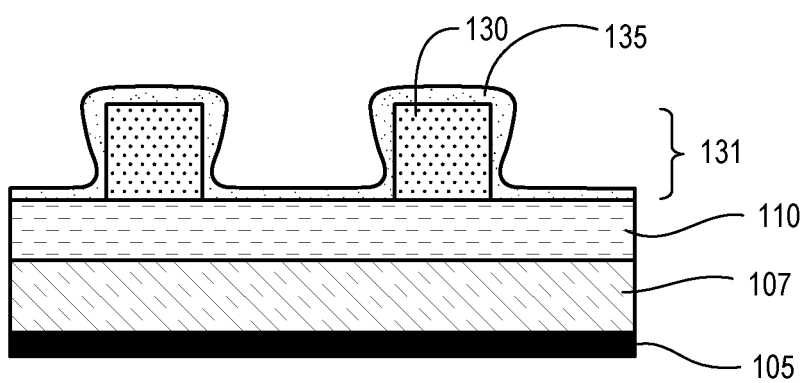

A deposition process is executed that deposits an organic polymer 135 on the first relief pattern 131. An example result is shown in FIG. 2. The deposition process includes using a plasma-based deposition process that includes a curing agent. The curing agent generates vacuum ultraviolet (VUV) light during plasma-based deposition. VUV light is typically between about 10 nm to 200 nm. Exposing photoresist material to VUV light is beneficial because such radiation can harden a given photoresist by interacting with the carbon-oxygen bonds. These bonds and or lactone groups and other constituents can absorb VUV light.

The deposition process is controlled such that more organic polymer 135 is deposited on upper portions of the structures 130 of the first relief pattern 131 as compared to organic polymer 135 deposited on lower portions of the structures 130 of the first relief pattern resulting in a reverse taper profile on vertical sidewalls of the structures 130 in that the upper portions of the structures 130 have wider cross-sections as compared to cross-sections of corresponding lower portions. In other words, more material is deposited on top of structures 130 or mandrels as compared to an amount of material deposited on the bottom of structures 130, as can be seen in the illustration of FIG. 2. Controlling the deposition process can include maintaining an isotropic deposition during plasma-based deposition. An isotropic deposition can be maintained by not using a substrate bias that would accelerate ions toward the substrate. Instead, essentially a line-of-sight deposition condition is created which results in more deposition on tops of features.

Figure 3:
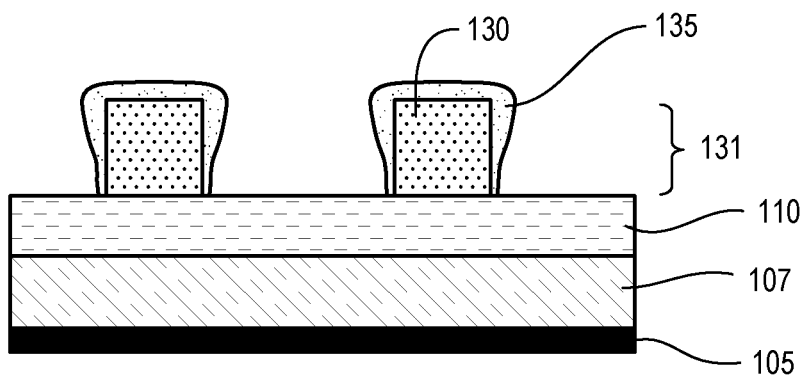

Substrate or photoresist processing can also include executing a trim process that etches a portion of the organic polymer. The trim process is a plasma-based process that includes a trim agent selected from the group consisting of oxygen-containing gas, hydrogen-containing gas, and nitrogen-containing gas. For example, $CO_2$ can be used as a trim agent. Some deposition gasses can be included for passivation. The trim process can include clearing organic polymer 135 from surfaces of underlying layer 110. An example result is shown in FIG. 3. A directional (anisotropic) etch or partially-directional etch can be used to clear organic polymer 135 from the substrate. In some embodiments, organic polymer 135 can be cleared from top surfaces of structures 130, or partially removed from such top surfaces. With isotropic deposition, more organic polymer 135 can be deposited on such top surfaces of structures 130 as compared to exposed surfaces of underlying layer 110. As can be seen in FIG. 3, a result is that the structures 130 now have a profile with a reverse taper, that is wider on top and narrower on the bottom. Such a reverse taper will function to compensate for compressive stresses of subsequent conformal layer(s).

In some embodiments, the deposition process and the trim process can be cycled until a predetermined critical dimension of the structures is achieved. The deposition process and the trim process can also be cycled to create a predetermined amount of reverse taper on vertical sidewalls of the structures 130. Executing the deposition process can include flowing a process chemistry into a plasma processing chamber with the process chemistry including $C_xH_y$ in an amount that is greater than 20% by volume of total process gas flow into the plasma processing chamber. In some embodiments the deposition process and the trim process are both executed in a same plasma processing chamber. The curing agent can be selected from any of argon, helium, hydrogen bromide, hydrogen, CxFy, xenon, neon, or combinations thereof.

Figure 4:
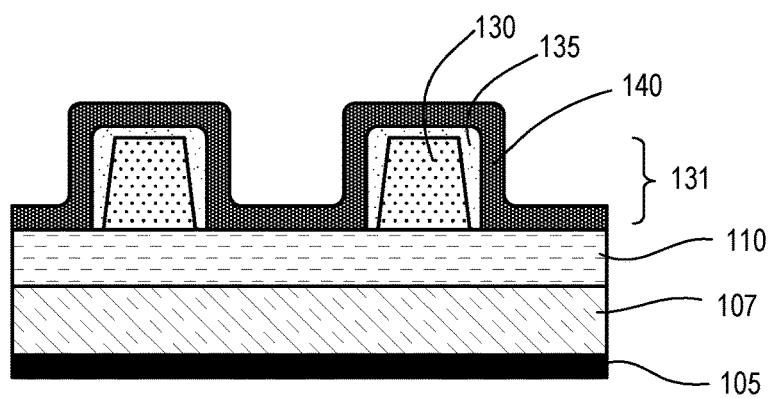

In one embodiment, the method includes forming sidewall spacers on the first relief pattern 131. Such spacer formation can include depositing a conformal film 140 on the substrate. FIG. 4 illustrates conformal film 140 having been deposited on the substrate. Note in FIG. 4 that although the structures 130 have been compressed to be narrower at the top of the structure cross section, the combination of the organic polymer 135 and the structures 130 provide a straight sidewall or a sidewall that is vertical (approximately vertical). In other words, as the mandrels were compressed on top, the reverse taper provided by the organic polymer 135 was also moved inwardly with the result being a vertical interface between the conformal film 140 and the combination of the organic polymer 135 and the structures 130. The organic polymer 135 deposited with a reverse taper profile provided a bias to each cross-section so that after compression a desired profile results. The amount of reverse taper profile can be adjusted based on type of photoresist, organic polymer, spacer material, scaled, etc., so that the conformal film 140 creates a compressive stress sufficient to cause the reverse taper profile to become a vertical profile.

Figure 5:
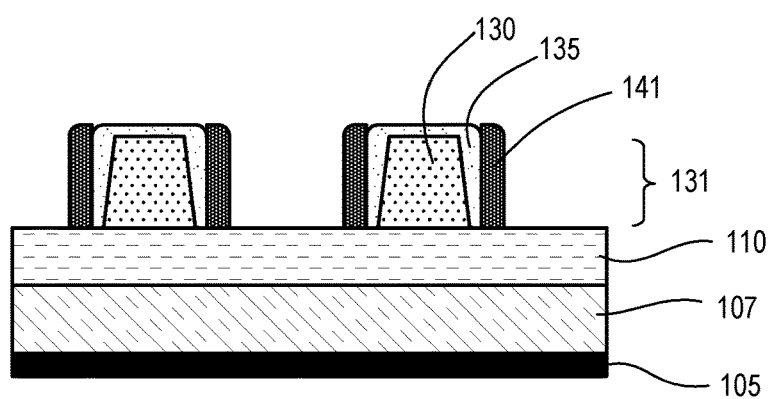

In FIG. 5, a spacer open etch step can be executed to remove conformal material from tops of horizontal surfaces. The result is sidewall spacers 141 having a vertical profile.

Figure 6:
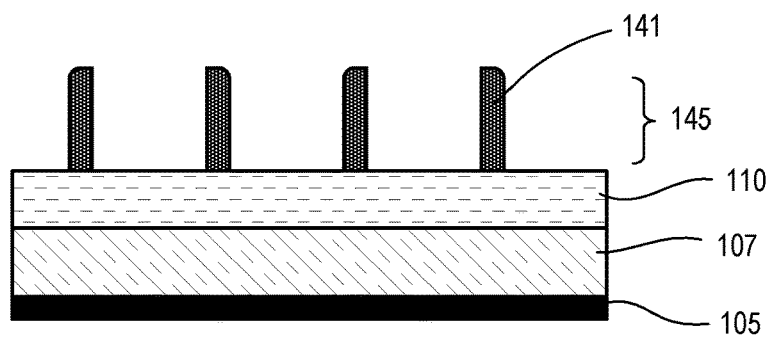

The mandrel materials (organic polymer 135 and structures 130) can then be removed or pulled, leaving sidewall spacers 141 on the underlying layer 110. This essentially creates a second relief pattern 145 as illustrated in FIG. 6. The second relief pattern 145 can be used as an etch mask when etching into the underlying layer 110, or as mandrels for an additional sidewall image transfer step, or for other fabrication processes. Accordingly, sidewall spacers can be pattern transferred without needing an additional hardmask layer and accompanying sacrificial layers. Using photoresist for mandrels, as enabled herein, can significantly reduce costs associated with self-aligned multi-patterning operations. Accordingly, in other words, techniques herein can address deformation of photoresist material during spacer formation. First, VUV curing can help harden the photoresist material itself for improved mechanical strength. Secondly, depositing a reverse taper profile polymer can compensate for mandrel deformation so that even with deformation from spacer material, a final orientation of spacer material is a vertical orientation, thereby enabling accurate pattern transfer.

In addition to such profile engineering embodiments, CDs can be targeted for correction or improvement. Techniques can include cycling the deposition process and the trim process until a predetermined critical dimension (target CD) of the structures is achieved. The deposition process and the trim process can be executed in a same plasma processing chamber. Such a cyclic deposition and trim process can be used to achieve any CD without regard to that printed at lithography, while simultaneously improving LER/LWR and CDU. With each consecutive cycle, an increased CD trim amount can be achieved.

Figure 7:
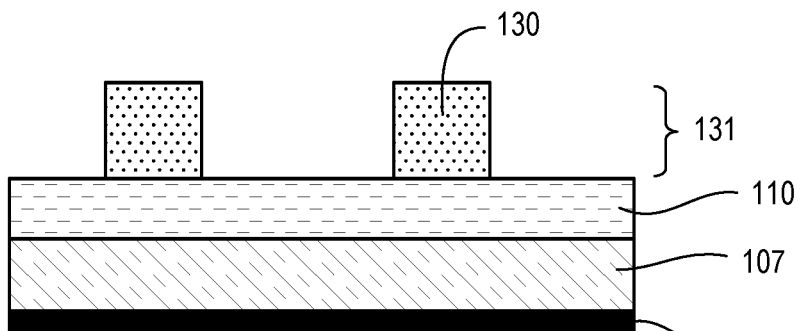
FIGS. 7-12 are cross-sectional schematic views of an example substrate segment showing a process flow according to embodiments disclosed herein.

Another embodiment includes a method for processing a substrate. Referring now to FIG. 7, a substrate is received having a first relief pattern 131. The first relief pattern 131 is formed of a photoresist material. The first relief pattern 131 includes structures 130 having vertical sidewalls. The first relief pattern 131 is positioned on an underlying layer 110, such as, for example, an anti-reflective coating layer, memorization layer, etc.

Figure 8:
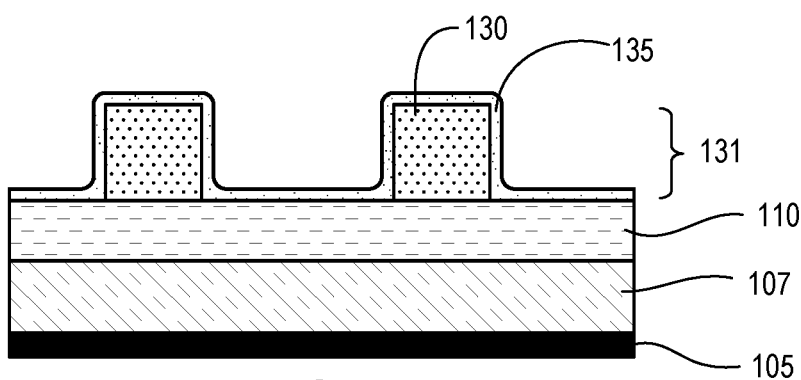

A deposition process is executed that deposits an organic polymer 135 on the first relief pattern 131. A result is shown in FIG. 8. The deposition process includes a plasma-based deposition process that includes a curing agent. The curing agent generates VUV light during plasma-based deposition. The deposition process is controlled such that a same amount of organic polymer 135 is deposited on upper portions of the structures 130 of the first relief pattern 131 as compared to organic polymer 135 deposited on lower portions of the structures 130 of the first relief pattern 131 resulting in a straight profile on vertical sidewalls of the structures 130. Controlling the deposition process can include maintaining an isotropic deposition during plasma-based deposition. In other words, deposition is controlled to provide a generally uniform thickness deposition on sidewalls of a VUV-hardened resist.

Figure 9:
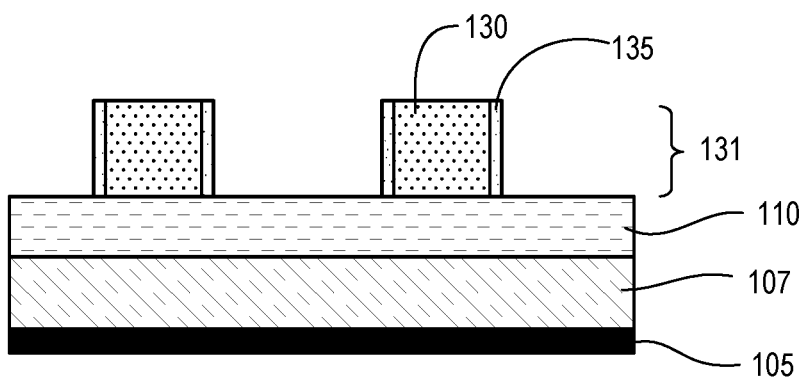
Figure 10:
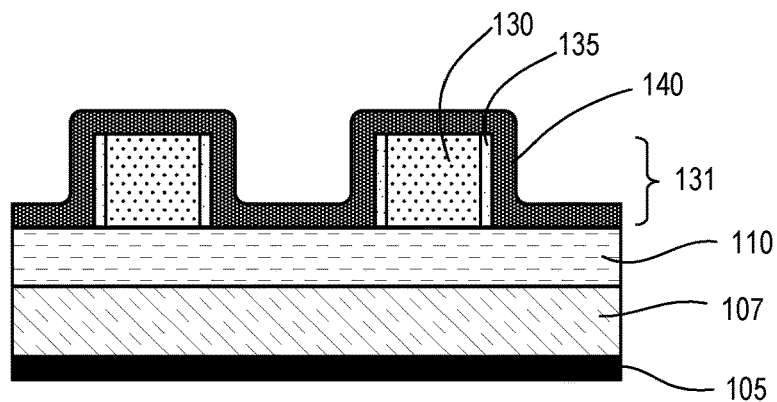
Figure 11:
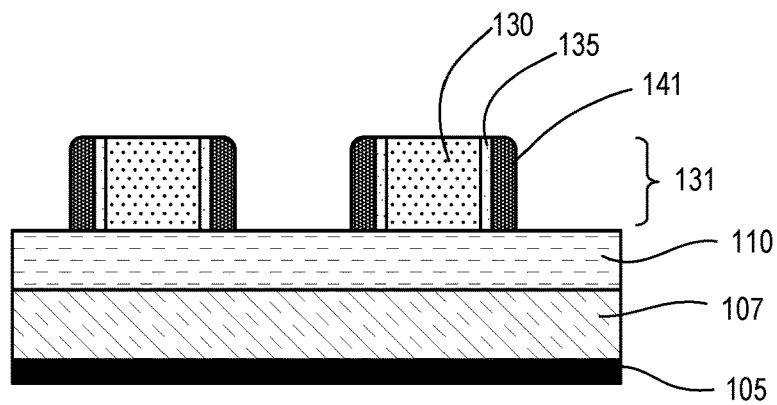

A trim process can be executed that etches a portion of the organic polymer 135. The trim process is a plasma-based process that includes a trim agent selected from an oxygen-containing gas, a hydrogen-containing gas, or a nitrogen-containing gas. Executing the trim process can include clearing organic polymer from surfaces of the underlying layer 110. A result is illustrated in FIG. 9. As described above, sidewall spacers 141 can be formed on the photoresist structures, and both the deposition and trim processes can be executed in a same plasma processing chamber. FIG. 10 shows deposition of conformal film 140, and FIG. 11, shows the substrate with sidewall spacers 141 after a spacer open etch is executed.

Cycling the deposition process and the trim process can be executed until a predetermined critical dimension (target CD) of the structures is achieved. Executing the deposition process can include flowing a process chemistry into a plasma processing chamber, the process chemistry including $C_xH_y$ in an amount that is between 5% to 10% by volume of total process gas flowed into the plasma processing chamber. Such a flow rate can be used for substantially conformal deposition on vertical surfaces of the relief pattern. The curing agent can be selected argon, helium, hydrogen bromide, hydrogen, CxFy, xenon, neon, etc.

Figure 12:
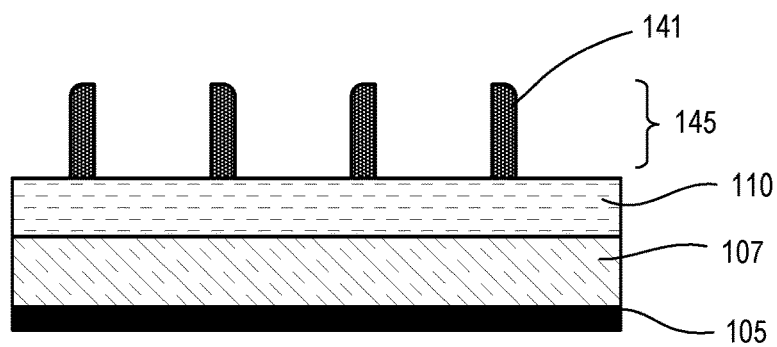

FIG. 12 shows the substrate segment after mandrel material has been removed, leaving sidewall spacer pairs on the substrate for further fabrication steps.

Another embodiment for processing a substrate includes receiving a substrate having a first relief pattern. The first relief pattern being formed of a photoresist material. The first relief pattern including structures having vertical sidewalls. The first relief pattern is positioned on an underlying layer. A plasma-based curing process is executed that uses a curing agent. The curing agent generates VUV light during plasma-based curing. Any of the previously-listed curing agents can be used. A trim process is executed that etches a portion of the photoresist material. The trim process is a plasma-based trim process that includes a trim agent such as an oxygen-containing gas, a hydrogen-containing gas, and/or a nitrogen-containing gas. The trim process can be controlled such that more photoresist material is etched from upper portions of the structures of the first relief pattern as compared to photoresist material etched from lower portions of the structures of the first relief pattern. This results in a positive taper profile on vertical sidewalls of the structures in that the upper portions of the structures have smaller cross-sections as compared to cross-sections of corresponding lower portions. Controlling the trim process can include maintaining an isotropic trim during the plasma-based trim process. In other words, a given photoresist CD can be reduced using this combination trim and curing step which reduces a CD as well as creates a positive taper photoresist cross section. This trim process can be continued until structures of the first relief pattern achieve a predetermined critical dimension. In other embodiments, sidewall spacers can be formed thereon as described previously.

Accordingly, techniques herein can enable photoresist profile engineering to eliminate spacer leaning thereby reducing edge placement error. CD targeting capability is also enabled to achieve any CD target without regard to lithography. Improved control over CD can also minimize pitch walking. Another benefit of techniques herein is improved CDU, LER/LWR as compared to lithography alone. Accordingly, techniques herein enable photoresist to be used as mandrels for lower cost SAQP schemes and other patterning schemes.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding.

Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for processing a substrate, the method comprising:
   receiving a substrate having a first relief pattern, the first relief pattern comprised of a photoresist material, the first relief pattern including structures having vertical sidewalls, the first relief pattern positioned on an underlying layer;
   executing a deposition process that deposits an organic polymer on the first relief pattern, the deposition process including a plasma-based deposition process that includes a curing agent, the curing agent generating VUV light during plasma-based deposition; and
   controlling the deposition process such that more organic polymer is deposited on upper portions of the structures of the first relief pattern as compared to organic polymer deposited on lower portions of the structures of the first relief pattern resulting in a reverse taper profile on vertical sidewalls of the structures in that the upper portions of the structures have wider cross-sections as compared to cross-sections of corresponding lower portions, wherein controlling the deposition process includes maintaining an isotropic deposition during plasma-based deposition;
   forming sidewalls spacers on the first relief pattern, wherein forming the sidewall spacers includes conformally depositing an amount of sidewall spacer material that creates a compressive stress sufficient to cause the reverse taper profile to become a vertical profile.

2. The method of claim 1, further comprising executing a trim process that etches a portion of the organic polymer, the trim process being a plasma-based process that includes a trim agent selected from the group consisting of oxygen-containing gas, hydrogen-containing gas, and nitrogen-containing gas.

3. The method of claim 2, wherein executing the trim process includes clearing organic polymer from surfaces of the underlying layer.

4. The method of claim 1, further comprising using the sidewall spacers as an etch mask when etching into the underlying layer.

5. The method of claim 2, further comprising cycling the deposition process and the trim process until a predetermined critical dimension of the structures is achieved.

6. The method of claim 2, further comprising cycling the deposition process and the trim process and controlling cycles of the deposition process and the trim process to create a predetermined amount of reverse taper on vertical sidewalls.

7. The method of claim 1, wherein executing the deposition process includes flowing a process chemistry into a plasma processing chamber, the process chemistry including CxHy in an amount that is greater than 20% by volume of total process gas flow into the plasma processing chamber.

8. The method of claim 2, wherein the deposition process and the trim process are both executed in a same plasma processing chamber, and wherein the curing agent is selected from the group consisting of argon, helium, hydrogen bromide, hydrogen, CxFy, xenon, and neon.

9. A method for processing a substrate, the method comprising:
   receiving a substrate having a first relief pattern, the first relief pattern comprised of a photoresist material, the first relief pattern including structures having vertical sidewalls, the first relief pattern positioned on an underlying layer;
   executing a plasma-based curing process that uses a curing agent, the curing agent generating VUV light during plasma-based curing;
   executing a trim process that etches a portion of the photoresist material, the trim process being a plasma-based trim process that includes a trim agent selected from the group consisting of oxygen-containing gas, hydrogen-containing gas, and nitrogen-containing gas;
   controlling the trim process such that more photoresist material is etched from upper portions of the structures of the first relief pattern as compared to photoresist material etched from lower portions of the structures of the first relief pattern resulting in a positive taper profile on vertical sidewalls of the structures in that the upper portions of the structures have smaller cross-sections as compared to cross-sections of corresponding lower portions, wherein controlling the trim process includes maintaining an isotropic trim during the plasma-based trim process; and wherein the trim process is continued until the structures of the first relief pattern achieve a predetermined critical dimension; and
   forming sidewall spacers on the first relief pattern and using the sidewall spacers as an etch mask when etching into the underlying layer.

10. A method for processing a substrate, the method comprising:
   receiving a substrate having a first relief pattern, the first relief pattern comprised of a photoresist material, the first relief pattern including structures having vertical sidewalls, the first relief pattern positioned on an underlying layer;
   executing a deposition process that deposits an organic polymer on the first relief pattern, the deposition process including a plasma-based deposition process that includes a curing agent, the curing agent generating VUV light during plasma-based deposition;

controlling the deposition process such that more organic polymer is deposited on upper portions of the structures of the first relief pattern as compared to organic polymer deposited on lower portions of the structures of the first relief pattern resulting in a reverse taper profile on vertical sidewalls of the structures in that the upper portions of the structures have wider cross-sections as compared to cross-sections of corresponding lower portions, wherein controlling the deposition process includes maintaining an isotropic deposition during plasma-based deposition;

executing a trim process that clears organic polymer from surfaces of the underlying layer;

forming sidewalls spacers on the first relief pattern; and using the sidewall spacers as an etch mask when etching into the underlying layer.

11. The method of claim 1, further comprising:

executing a trim process that clears organic polymer from surfaces of the underlying layer.

12. The method of claim 10, wherein the trim process is a plasma-based process that includes a trim agent selected from the group consisting of oxygen-containing gas, hydrogen-containing gas, and nitrogen-containing gas.

13. The method of claim 10, further comprising cycling the deposition process and the trim process until a predetermined critical dimension of the structures is achieved.

14. The method of claim 10, further comprising cycling the deposition process and the trim process and controlling cycles of the deposition process and the trim process to create a predetermined amount of reverse taper on vertical sidewalls.

15. The method of claim 10, wherein the deposition process and the trim process are both executed in a same plasma processing chamber, wherein the curing agent is selected from the group consisting of argon, helium, hydrogen bromide, hydrogen, $C_xF_y$, xenon, and neon, and wherein executing the deposition process includes flowing a process chemistry into a plasma processing chamber, the process chemistry including $C_xH_y$ in an amount that is greater than 20% by volume of total process gas flow into the plasma processing chamber.

16. The method of claim 10, wherein forming the sidewall spacers includes conformally depositing an amount of sidewall spacer material that creates a compressive stress sufficient to cause the reverse taper profile to become a vertical profile.

* * * * *

UNITED STATES PATENT AND TRADEMARK OFFICE
CERTIFICATE OF CORRECTION

PATENT NO. : 10,049,892 B2  
APPLICATION NO. : 15/145010  
DATED : August 14, 2018  
INVENTOR(S) : Nihar Mohanty et al.

Page 1 of 1

It is certified that error appears in the above-identified patent and that said Letters Patent is hereby corrected as shown below:

In the Specification

In Column 4, Line 51, "and the structures 130 provide a" should read ---and the structures 130 provides a---.

In the Claims

In Column 7, Line 60, Claim 1, "forming sidewalls spacers" should read ---forming sidewall spacers---.

In Column 9, Line 17, Claim 10, "forming sidewalls spacers" should read ---forming sidewall spacers---.

Signed and Sealed this  
Sixth Day of November, 2018

Andrei Iancu  
*Director of the United States Patent and Trademark Office*